United States Patent [19]

Haselgrove

[11] Patent Number: 4,567,440

[45] Date of Patent: Jan. 28, 1986

[54] VIVO P-31 NMR IMAGING OF PHOSPHORUS METABOLITES

[76] Inventor: John C. Haselgrove, Johnson Research Foundation, School of Medicine, University of Pennsylvania, Philadelphia, Pa. 19104

[21] Appl. No.: 502,513

[22] Filed: Jun. 9, 1983

[51] Int. Cl.[4] .................... G01R 33/22; G01N 24/06
[52] U.S. Cl. .................................. 324/309; 324/318
[58] Field of Search ............... 324/307, 309, 310, 312, 324/318, 319, 300

[56] References Cited

U.S. PATENT DOCUMENTS

| | | | |
|---|---|---|---|
| 4,318,043 | 3/1982 | Crooks et al. | 324/309 |
| 4,468,621 | 8/1984 | Hinshaw | 324/309 |
| 4,490,675 | 12/1984 | Knuettel et al. | 324/319 |

Primary Examiner—Ernest F. Karlsen
Assistant Examiner—Kevin D. O'Shea
Attorney, Agent, or Firm—Herman L. Gordon

[57] ABSTRACT

A system for imaging P-31 spectra from different slices through a living body specimen positioned in the bore of the hollow main field magnet of an NMR spectrometer, consisting of applying a timed series of different discrete different-amplitude magnetic field gradient pulses to the specimen, whereby to generate time-spaced echo signals from respective points along the specimen while timed RF resonance excitation pulses are applied to the specimen. The echo signals are used to derive respective chemical shift spectra from the points, each spectrum containing information showing the in vivo metabolic state at one of the points. The various spectra can be simultaneously displayed to enable concurrent slice-by-slice interpretation of the metabolic information. The gradient pulses are derived from coils mounted inside the main field magnet arranged to generate a magnetic field vector traversing the specimen. The gradient coils are energized by using a suitably programmed computer. The gradient current pulses are applied concurrently with the RF excitation pulses.

12 Claims, 9 Drawing Figures

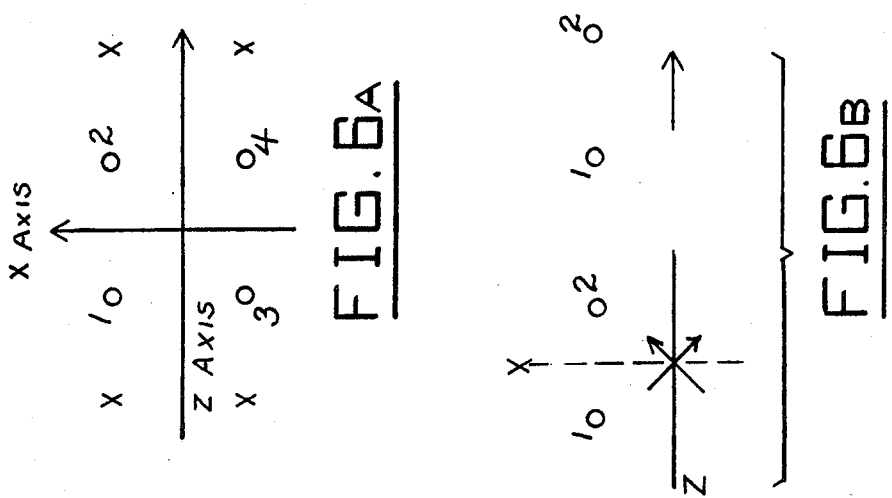
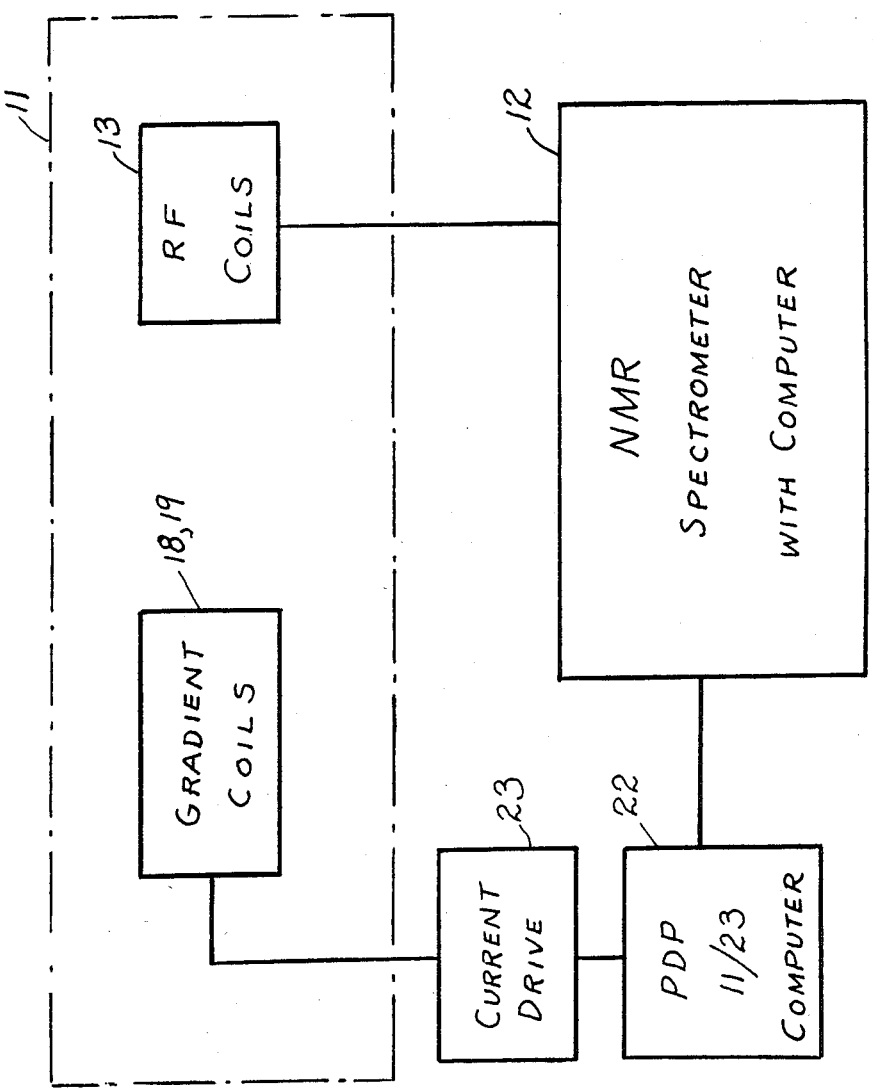

VIVO P-31 NMR IMAGING OF PHOSPHORUS METABOLITES

FIELD OF THE INVENTION

This invention relates to non-invasive systems for obtaining medically and scientifically significant information from living bodies, and more particularly to an improved method and means for in vivo NMR imaging using phase-encoded spin echoes for obtaining one-dimensional discrimination of P-31 spectra from different parts of phantoms, muscle, and other body tissues, including brain tissue.

BACKGROUND OF THE INVENTION

Phosphorus nuclear magnetic resonance (P-31 NMR) is now established as a valuable non-invasive method for investigation of the metabolic state of tissues in vivo.

Nuclear magnetic resonance (NMR) offers the opportunity of selectively examining the nature and function of nucleii of atoms attached to a variety of important biochemicals, of which phosphorus and carbon appear to be currently the most useful and are pivotal in cell metabolism as well. Nuclear mangetic resonance can be most simply described as a pulsed nuclear clock, the rate of which is sensitively dependent upon the chemical environment of the particular nucleus. For example, the atoms of phosphorus, which are attached to a series of key energy-related compounds of the body, give an appropriate signature where the important phosphate compounds in the brain, heart, kidney, liver, and skeletal tissues are the high energy compounds, adenosine triphosphate (ATP), the "energy currency" of the body, and creatine phosphate (PCr), the "short-term energy reserve" of the body, together with low-energy forms of these compounds, adenosine diphosphate (ADP) and inorganic phosphate ($P_i$). In addition, the sugar phosphate derived from the metabolic pathway activated by glucose metabolism can also be found (F6P, DPG).

In order to realize the full potential of the method, it is important to be able to discriminate between different spatial regions of the tissue under examination. There is a definite need for a more versatile approach than has been available in the past for using NMR imaging techniques to discriminate substantially simultaneously spatially different regions of the tissue under examination, for example, for substantially simultaneously showing the P-31 spectra from different planes through the tissue.

SUMMARY OF THE INVENTION

Accordingly, a main object of the invention is to provide a novel and improved system for performing in vivo spectral imaging, in which spatial information is encoded as the phase of an RF echo and wherein it is possible to retain the spectral information needed for interpretation of the metabolic information associated with spaced slices of the tissue under examination.

A further object of the invention is to provide an improved system for performing P-31 NMR spectral imaging wherein discrete spectra can be obtained in vivo from slices of tissue of relatively small thickness.

A still further object of the invention is to provide an improved system for performing NMR spectral imaging on a specimen positioned within the bore of the magnet of an NMR spectrometer assembly and exposed to RF excitation pulses, wherein pulsed magnetic field gradients are applied to the specimen, whereby the atomic spins at each point along the gradient direction are caused to precess with different Larmor frequencies, the pulsed magnetic field gradients being incremented in strength and the RF echoes obtained thereby corresponding to regions of the specimen spaced along the gradient direction in accordance with the strengths of said gradients.

A still further object of the invention is to provide an improved non-invasive system for in vivo phosphorus imaging using phase-encoded spin echoes to obtain one-dimensional discrimination of P-31 spectra from different parts of phantoms, muscle and brain tissue, wherein the metabolic state of different spatial regions of the material under study can be discriminated and imaged, and wherein the P-31 NMR signals from different metabolites can be distinguished by chemical shift differences.

BRIEF DESCRIPTION OF THE DRAWINGS

Further objects and advantages of the invention will become apparent from the following description and claims, and from the accompanying drawings, wherein:

FIG. 1 is a block diagram of a typical NMR spectrometer system for phase-encoded phosphorus imaging according to the present invention.

FIGS. 6A and 6B are diagrams to illustrate the resolution of the magnetic field strength vectors associated with the gradient coils employed in the system.

DETAILED DESCRIPTION OF A PREFERRED EMBODIMENT

Figure 2:
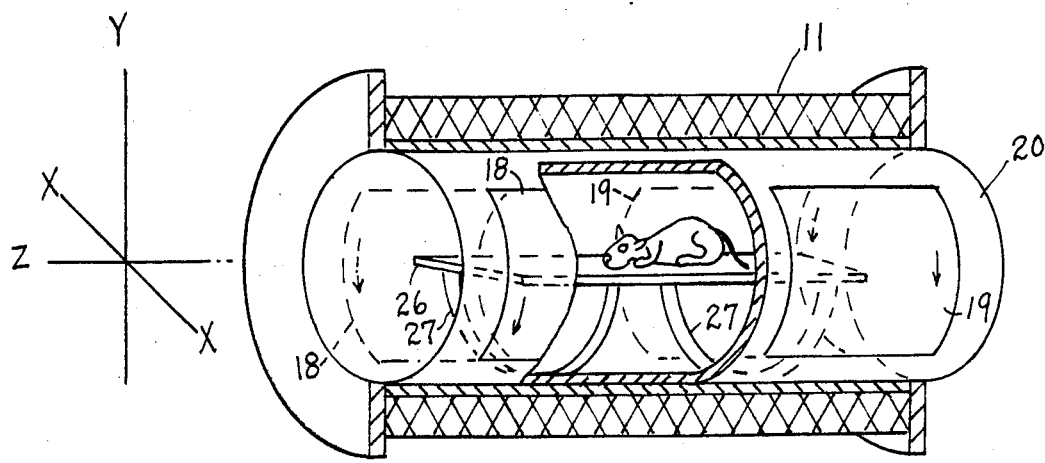
FIG. 2 is a longitudinal cross-sectional perspective view of the main field magnet and the associated field gradient surface coil array employed in the system of FIG. 1, showing how a live specimen is supported in the main field magnet for NMR spectral analysis.

Referring to the drawings, a system according to the present invention employs an arrangement basically illustrated diagrammatically in FIG. 1, comprising a hollow, longitudinally extended, horizontally positioned NMR magnet 11, for example, an Oxford Instruments 7-inch bore magnet, in association with an NMR spectrometer and computer 12, wherein the spectral frequency employed is that for P-31, namely, 24.3 MHz. The RF coil unit, shown at 13, may comprise a single Helmholtz RF coil (a two-turn split RF coil with coil separation of about 25 mm), used for RF excitation and detection in a conventional manner. One-dimensional imaging is performed using a phase-encoded spin echo method employing repeated pulse sequences shown in FIG. 6, controlled by the spectrometer unit 12. A spin echo is formed by applying a 90° RF pulse 14, followed after a time period T by a 180° RF pulse 15. During the time period T, which may be of the order of 20 ms, pulsed magnetic field gradients 16 are applied to the specimen (supported within the bore of hollow magnet 11 with the specimen's head located within the RF coil 13 in RF coupling relation therewith, as shown in FIG. 5). These gradients cause the P-31 spin at each point along the gradient direction (in this case along a horizontal transverse axis X (see FIG. 4), suitably oriented transversely to the specimen) to precess with a Larmor frequency which depends on the X-axis location of said point, so that at the time of application of the 180° RF pulse the phase of the spin component will depend on its location along the X axis. The gradients 16 are linearly incremented in intensity in the time sequence shown in FIG. 6, so that the spins are thus "phase-encoded" with respect to the positions along the X axis and so that at the time of application of the 180° RF pulses, the phase of each spin component will depend on its position along the X axis. The "null" value of the gradient, shown at 17, represents the uniform field strength value in the interior bore of magnet 11.

Figure 3:
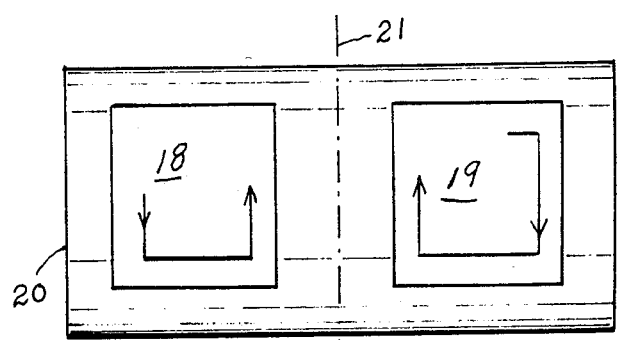
FIG. 3 is a side elevational view of the gradient field coil assembly employed in FIG. 2.
Figure 4:
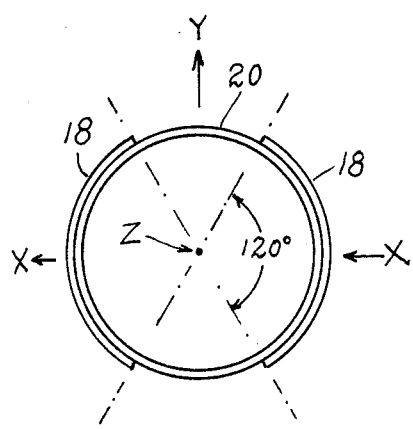
FIG. 4 is an end elevational view of the gradient field coil assembly of FIG. 3.
Figure 5:
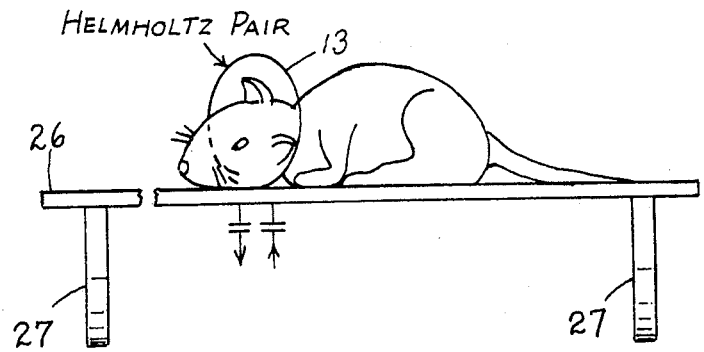
FIG. 5 is an enlarged side elevational view of the specimen and supporting platform employed in FIG. 2.
Figure 6:
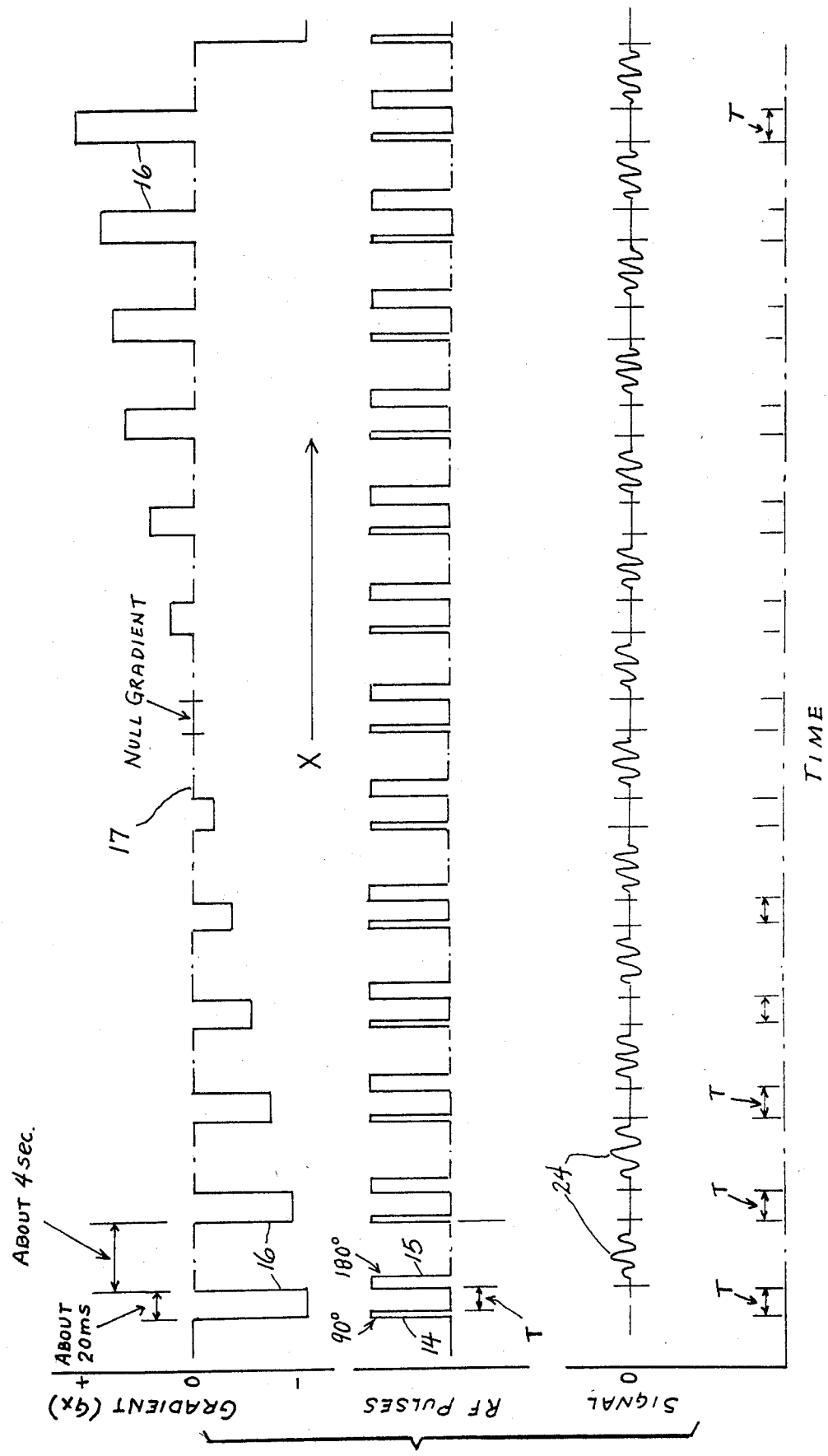
FIG. 6 is a compressed timing diagram showing typical relationships of the magnetic field pulsed gradients, the excitation RF pulses, and the RF echo signals in a typical P-31 spectral imaging system, such as that shown in FIG. 1.

Referring to FIGS. 2-4, the magnetic field gradients shown in FIG. 6 are generated by two pairs of symmetrically mounted surface coils 18, 19 secured on diametrically opposite sides of a non-magnetic cylindrical supporting shell member 20 mounted in the hollow main magnet and closely fitting its inside surface, each pair of coils 18, 19 being located symmetrically with respect to the transverse vertical central X-Y plane 21, and the coils 18, 18 and 19, 19 being symmetrically located on opposite sides of the longitudinal vertical Y-Z plane. The surface coils 18, 19 subtend approximately 120° around the longitudinal Z axis, as shown in FIG. 4.

The surface coils are pulsed via a PDP 11/22 unit 22 and a current drive unit 23, under the control of the NMR spectrometer and computer stage 12, to provide timed respective incremented pulse currents flowing in the coils 18, 19 in the directions indicated in FIG. 3. The pulse currents generate respective magnetic field strength vectors which are resolved to define resultant X-distributed magnetic field strength vectors providing the gradient pulses 16 shown in FIG. 6.

This is explained as follows, referring to FIGS. 6A and 6B: Imagine a horizontal slice through the X-gradient coils; there will be four wires carrying current out of the paper (drawn) as circles) and four wires carrying it back (drawn as x symbols).

Consider the field near the center point produced by the four wires 1–4. At the center point, coils 1 and 2 produce fields as shown at the left in FIG. 6B, with a net result shown at the right in FIG. 6B.

By symmetry, the wires 3 and 4 produce an equal result in the opposite direction and there is no net field. As we move off the Z axis along the X axis, wires 1 and 2 always produce a field along the +Z direction, while wires 3 and 4 produce the opposite effect. But because the field is inversely proportional to the square of the distance from the wires, the field from wires 1 and 2 increases while that from wires 3 and 4 decreases as we approach wires 1 and 2, resulting in a net axial rightwardly-directed component. As we approach wires 3 and 4 the net axial field is leftward, nemely, reversed. Near the origin, with appropriate positions of wires, the effect is such that the resultant axial field varies linearly with the distance off the Z axis along X. The return wires have a similar, but smaller, effect in reverse.

The current pulses to the gradient coils are controlled by the PDP 11/23 unit 22 to generate recurrent trains of the equally incremented gradient pulse wave shape sequence shown in FIG. 6, comprising a series of equally decremented negative (relative to "null" value 17) diminishing-strength pulses, an intermediate "null gradient" (zero gradient) stage 17, and a series of positive, equally incremented increasing-strength gradient pulses relative to the null value. The gradient pulses are spaced by a sufficient time interval to allow echo collection, for example, about 4 seconds.

Thus, the echo signals, shown at 24 in FIG. 6, are collected at "zero gradient", so that under these conditions the precession frequency depends only on the chemical shift. A series of N different echoes may be collected, corresponding to N equally incremented "phase encoding" X values. For example FIG. 6 shows 13 values, thereby providing 13 equally spaced X values for a complete sequence of N echoes. The complete sequence of N echoes may be repeated a number of times for signal averaging.

The averaged echoes 24 are subjected by the computer system associated with the spectrometer unit 12 to a two-dimensional Fourier transformation to yield respective spectra (shown, for example, at 25 in FIG. 7) as functions of position along the X axis. The spatial resolution and total field of view are related to the number and values of the field gradients by the characteristics of the digital, discrete Fourier transforms in a manner similar to that in which the spectral resolution and sweep width are related to the temporal sampling of the free induction decays (FID) or echoes.

The PDP 11/23 unit 22 is a conventional computer which is specifically programmed to control the time, duration and amplitudes of the currents furnished to the gradient coils 18, 19 via the current drive unit 23. The programmed computer 22 is enabled by the computer system forming part of the NMR spectrometer unit 12.

From FIG. 6 it will be seen that the echoes 24 are collected sequentially in the time intervals (about 4 seconds) between the successive gradient pulses 16, namely, between the 180° RF pulses 15 and the next 90° excitation pulses 14. The respective echoes 24 are recorded for a substantial number of repeated sequences of N echoes, and are then averaged. The averaged echoes are subjected to a two-dimensional Fourier transformation to yield the respective spectra 25 as functions of position along the X axis. The respective spectra are then stored and subsequently may be simultaneously displayed in the manner illustrated in FIG. 7, namely, as functions of specific positions along the X axis, corresponding to slices.

Figure 7:
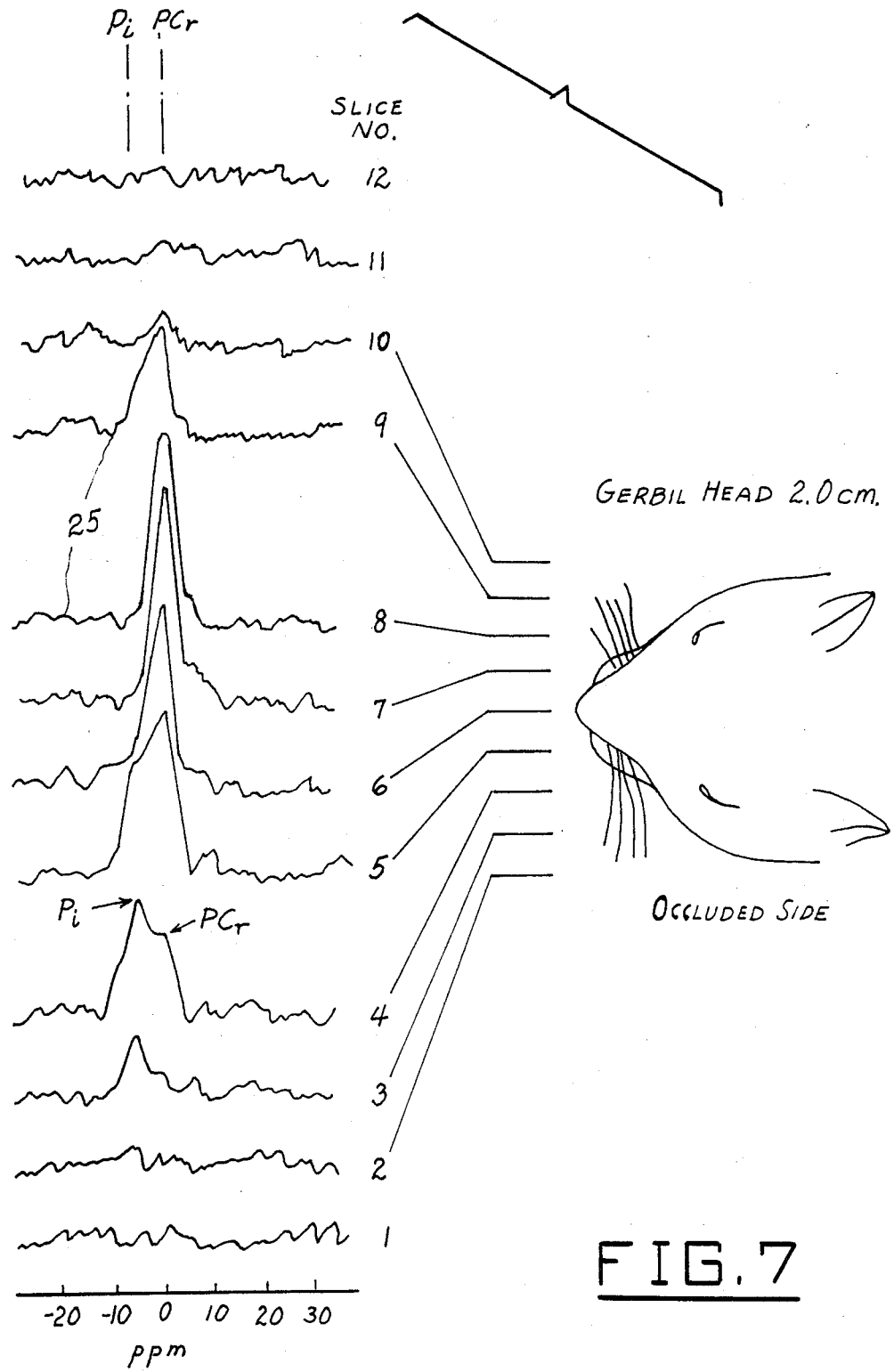
FIG. 7 shows a typical set of spectra comprising P-31 spectra obtained from the head of a live animal in which the carotid artery is occluded to form a unilateral ischemia, wherein the animal's head was placed in the homogeneous main field of the magnet and the field gradients were applied along a transverse axis aligned with the ears of the animal, using the system of FIG. 1 and FIG. 2.

In the typical experimental example illustrated in FIGS. 2, 5 and 7, to discriminate between the right and left hemispheres of a gerbil head, one carotid artery was occluded and the gerbil was supportingly positioned on a platform element 26 having opposite depending, semicircular, resilient transverse leg structures 27, 27, shaped to adjustably fit within the shell member 20. The gerbil's head was received in the NMR probe coil assembly 13 in the manner illustrated in FIG. 5, and the platform was adjusted to place the animal's ears and the probe coil 13 substantially in the X-Y plane 21. In this experimental model of stroke, the animal was first rendered hypoxic by a diminution of inspired oxygen, and one hemisphere of the animals's brain was rendered more hypoxic than the other by unilateral occlusion of the common carotid artery. As shown in FIG. 7, spectra 25 were obtained for 9 gradient values, for the region transversely relative to the longitudinal axis of main magnet 11, corresponding to the location of the gerbil's head (9 echoes were collected, with an average of 100 scans on each echo, to give a spatial resolution of 5.8 mm). The overall experimental run time was about one hour. One can clearly discern the differences between the right and left halves of the gerbil head in FIG. 7 by measuring the relative amounts of $P_i$ and PCr in the series of spectra 25.

The experimental results above described demonstrate the practicality of performing in vivo P-31 NMR spectral imaging on a wide range of living tissue specimens, employing the above-described method. By using the above-described imaging technique, in which spatial information is encoded as the phase of an echo, it is possible to retain the spectral information needed for slice-by-slice interpretation of the phosphate metabolic information. The experimental data also demonstrates that discrete spectra can be obtained in vivo from slices only a few mm thick.

The above-described method can be readily employed to study the phosphate metabolic information for the human head and for other living parts of a human body or of a living animal, by using suitably scaled-up equipment conformable with the linear dimensions of the specimens to be studied.

The technique of spatially resolving metabolic spectra according to the present invention may be extended to obtain two-dimensional slice information for living specimens, or even three-dimensional information; the technique may also be extended to nucleii other than phosphorus, such as F-19, C-13, Na-23, etc. Also, gradient pulse time sequences other than the specific pulse time sequence above described, and illustrated in FIG. 6, may be employed within the spirit of the present invention.

Various modifications within the spirit of the present invention may occur to those skilled in the art. It is intended that such modifications should be comprehended within the meaning and range of equivalents of the disclosed embodiment.

What is claimed is:

1. A method of obtaining spatial spectral information from a living body specimen comprising the steps of positioning the specimen in the bore of the hollow main field magnet of an NMR spectrometer of the type having a main field magnet having a bore with a longitudinal axis, and having an RF probe member in said bore, with the specimen located in RF coupling relation to said probe member, applying a timed series of discrete progressively different-amplitude magnetic field gradient pulses to the specimen with time intervals therebetween to phase-encode the atomic spins of the nucleii of interest in the specimen at progressively different points along a line adjacent to the probe member perpendicular to said longitudinal axis in accordance with the amplitudes of said gradients and to generate different spin phase conditions at said points, applying RF resonance excitation pulses to said probe member at a radio frequency to produce echo signals corresponding to the metabolic state of the specimen, collecting the echo signals therefrom in the respective time intervals between the magnetic field gradient pulses, converting the respective echo signals into chemical shift spectra, each spectrum containing information corresponding to the metabolic state of the specimen at a respective one of said progressively different points, repeatedly collecting echo signals over a plurality of sequences of said timed series, averaging the echo signals collected for the respective magnetic field gradient amplitude values, and converting the averaged echo signals into said chemical shift spectra.

2. The method of claim 1, and wherein said line containing said points extends substantially transversely to the axis of the base of the main field magnet.

3. The method of claim 1, and wherein said magnetic field gradient pulses are of substantially similar duration.

4. The method of claim 1, and wherein said magnetic field gradient pulses are substantially linearly equally incremented.

5. The method of claim 1, and wherein said series of magnetic field gradient pulses includes a null amplitude value representing the uniform field strength value in the bore of the NMR magnet.

6. The method of claim 5, and wherein said null amplitude value occurs at the intermediate portion of the series of magnetic field gradient pulses.

7. The method of claim 1, wherein said line containing said points extends substantially transversely to the longitudinal axis of the bore of the main field magnet and wherein said field gradient pulses are generated by magnetic fields provided substantially symmetrically on opposite sides of a transverse radial plane containing said line.

8. In an apparatus for obtaining spatial metabolite spectral information from a living body specimen, an NMR spectrometer including a hollow longitudinally extended main field magnet with a substantially uniform mangetic field therein and having a longitudinal axis, means to support a living body specimen in said magnet, and RF probe means mounted in said magnet in a position to be electromagnetically coupled to a specimen on said support means, said probe means being provided with means to sequentially apply RF resonance excitation pulses to such specimen and means to collect RF echo signals due to the refocussing of spins of atoms in the specimen generated responsive to the RF excitation pulses, and means to apply a timed series of discrete different-amplitude magnetic field gradient pulses to the interior of the main magnet adjacent said support means concurrently with the RF excitation pulses and being oriented so as to phase-encode nucleii of interest in the specimen at different points along a line adjacent to said probe means perpendicular to said longitudinal axis respectively in accordance with the amplitudes of said gradient pulses, wherein said series of gradient pulses are substantially linearly equally incremented in amplitude and includes one zero-amplitude stage relative to the uniform magnetic field strength of the NMR main magnet, and wherein the zero-amplitude stage occurs at the intermediate portion of the series of gradient pulses.

9. The apparatus of claim 8, and wherein said means to apply said magnetic field gradient pulses comprising an array of surface coils conformably mounted inside said main field magnet.

10. The apparatus of claim 8, and wherein said means to apply said magnetic field gradient pulses comprises an array of surface coils mounted inside said main field magnet and arranged substantially symmetrically relative to a transverse plane perpendicular to and containing said line.

11. The apparatus of claim 8, and wherein said means to apply said magnetic field gradient pulses comprises an array of surface coils mounted inside said main field magnet and arranged substantially symmetrically relative to a radial plane substantially normal to said support means.

12. The apparatus of claim 8, and wherein said means to apply said timed series of different-amplitude magnetic field gradient pulses comprises magnet coil means mounted within the main field magnet, current pulse supply means connected to said magnet coil means, and programmed computer means to control the time and amplitudes of the current pulses provided by said supply means.

* * * * *